United States Patent
Martin et al.

(10) Patent No.: US 7,464,345 B2
(45) Date of Patent: Dec. 9, 2008

(54) RESOURCE ESTIMATION FOR DESIGN PLANNING

(75) Inventors: Gregor J. Martin, Mountain View, CA (US); Grant Lindberg, Pleasanton, CA (US); Ying Chun He, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 229 days.

(21) Appl. No.: 11/194,299

(22) Filed: Aug. 1, 2005

(65) Prior Publication Data

US 2007/0028196 A1  Feb. 1, 2007

(51) Int. Cl.
*G06F 17/50* (2006.01)
(52) U.S. Cl. .................. 716/1; 716/2; 716/3; 716/18
(58) Field of Classification Search .............. 716/2, 716/1, 16–18, 3
See application file for complete search history.

(56) References Cited

U.S. PATENT DOCUMENTS

| | | | | |
|---|---|---|---|---|
| 6,317,860 B1 * | 11/2001 | Heile | .................. | 716/5 |
| 6,496,972 B1 * | 12/2002 | Segal | .................. | 716/18 |
| 6,789,248 B1 * | 9/2004 | Lu et al. | .................. | 716/18 |
| 7,134,100 B2 * | 11/2006 | Ravi et al. | .................. | 716/2 |
| 7,162,706 B2 * | 1/2007 | Kuang et al. | .................. | 716/6 |
| 7,299,446 B2 * | 11/2007 | He et al. | .................. | 716/18 |
| 7,308,564 B1 * | 12/2007 | Jenkins, IV | .................. | 712/227 |
| 2002/0162086 A1 * | 10/2002 | Morgan | .................. | 716/18 |
| 2003/0028864 A1 * | 2/2003 | Bowen | .................. | 717/141 |
| 2003/0105620 A1 * | 6/2003 | Bowen | .................. | 703/22 |
| 2003/0115564 A1 * | 6/2003 | Chang et al. | .................. | 716/8 |
| 2004/0025129 A1 * | 2/2004 | Batchelor | .................. | 716/6 |
| 2005/0198601 A1 * | 9/2005 | Kuang et al. | .................. | 716/6 |
| 2005/0268258 A1 * | 12/2005 | Decker | .................. | 716/4 |
| 2006/0129963 A1 * | 6/2006 | Martin et al. | .................. | 716/11 |
| 2006/0225004 A1 * | 10/2006 | Goto | .................. | 716/1 |
| 2006/0271904 A1 * | 11/2006 | Emerson et al. | .................. | 716/18 |
| 2008/0134107 A1 * | 6/2008 | Wang et al. | .................. | 716/2 |

* cited by examiner

*Primary Examiner*—Jack Chiang
*Assistant Examiner*—Suchin Parihar
(74) *Attorney, Agent, or Firm*—Christopher P. Maiorana, PC

(57) ABSTRACT

A method for estimating resources during design planning is generally provided. A first step generally involves receiving design information for an integrated circuit design. A first portion of the integrated circuit design is generally complete, while a second portion of the integrated circuit design is generally incomplete. A second step generally involves receiving user input of estimated design information for the second portion of the integrated circuit design. A third step generally involves automatically generating one or more representative blocks representing the second portion of the integrated circuit design based on the user input. The one or more representative blocks may be generated having substantially equivalent size and characteristics to one or more actual blocks developed for the second portion of the integrated circuit design.

20 Claims, 2 Drawing Sheets

RESOURCE ESTIMATION FOR DESIGN PLANNING

FIELD OF THE INVENTION

The present invention relates to integrated circuit design planning generally and, more particularly, to resource estimation for design planning.

BACKGROUND OF THE INVENTION

Frequently, design planning (e.g., die size/device selection, layout analysis, power estimation, etc.) is performed early in a design cycle. Because the design planning can be performed a long time before the actual design is complete (i.e., RTL finished), design planning tasks are often performed with "rules of thumb" based on experience of the designer. When the design planning tasks are not performed early or the design planning tasks are not estimated correctly, a project can suffer a major set-back. For example, a project can be set-back when design analysis assumptions (i.e., ability to fit a design into a particular programmable platform device) are incorrect.

Complex designs that are suitable candidates for use with platform (or structured) application specific integrated circuits (platform ASICS) can be incomplete when a customer needs to make design decisions (e.g., select the platform, device or slice), calculate cost and margin based on the slice selected, etc.). Serious problems can arise when, later in the design process, the customer finds that the design does not fit the selected platform, device or slice. Often, parts of the design can be complete (i.e., third party IP and legacy code) and parts of the design can still be in development (i.e., new design blocks).

As used herein, the term slice generally refers to a partially manufactured semiconductor device in which the wafer layers up to the connectivity layers have been fabricated. The slice generally comprises a base semiconductor wafer (e.g., from silicon, silicon-on-insulator, silicon germanium, gallium arsenide, other Type II, III, IV, and V semiconductors, etc.). The slice generally comprises a piece of semiconductor material into which blocks or hardmacs have been diffused into the semiconductor layers. Diffusing a semiconductor wafer to create a hardmac simply means that during fabrication of the wafer layers, transistors or other electronic devices have been particularly arranged in the wafer layers to achieve specific functions, such as diffused memory, data transceiver hardware (e.g., I/O PHYs), clock factories (e.g., PLLs, etc.), control I/Os, configurable input/output (I/O) hardmacs, etc. Each of the hardmacs generally has an optimum arrangement and density of transistors to realize a particular function. The slice may further comprise an area of transistor fabric for further development of the slice using a suite of generation tools described herein. The transistor fabric generally comprises an array of prediffused transistors in a regular pattern that can be logically configured by placement of one or more metal layers. Different slices may contain different amounts and arrangements of transistor fabric, different amounts of diffused and/or compiled memories, both fixed and configurable I/O blocks, clocks, etc. depending upon the purpose of the final integrated chip.

Accurately estimating the requirements of a design can be difficult for customers, especially less experienced ones. Currently there are two ways design requirements can be estimated: 1) the engineer estimates the overall gate count (and thus the die area/slice required) based upon experience and design knowledge or 2) the customer works with a manufacturer's field support representative to select a platform, device or slice. In an example of the first method, the engineer may estimate the design will be two million gates, and therefore selects a slice that the datasheet indicates can fit two million gates. With the second method, a more accurate estimation can be made, but the estimation is still subject to accuracy problems.

The first solution is undesirable because of the reliance on the expertise of the engineer. The engineer can easily misestimate the overall die size/slice required. Even a manufacturer's field support representative can have limited ability and experience in accurately estimating gate counts due to a lack of available tools. There is currently no cohesive way to collate and interpret all information about a design until the design is completed. A customer may have a datasheet of the existing IP characteristics (i.e., gate count, power usage, etc.) and estimations of the characteristics for any missing blocks. Maintaining, understanding and making decisions based upon the information can be difficult when spread across many different sources.

With conventional tools, users cannot progress with a 'trial design flow' until they have all the RTL and memory instantiations. Thus, design planning and/or synthesis cannot be performed to find any large problems early in the design cycle. Furthermore, timing estimation of levels of logic for a given block is not possible until after the RTL is written. Power and utilization estimation (e.g., based on logic density, not just gate count) is also not possible before the RTL is complete. A trial design flow is used on platform ASICs because platform ASICs can have a relatively high routing-related density impact compared with cell-based ASICs where logic has more routing layers.

The ability to accurately predict utilization, power and/or performance before the actual RTL is complete may provide designers with a huge advantage over conventional solutions.

SUMMARY OF THE INVENTION

The present invention concerns a method for estimating resources during design planning is generally provided. A first step generally involves receiving design information for an integrated circuit design. A first portion of the integrated circuit design is generally complete, while a second portion of the integrated circuit design is generally incomplete. A second step generally involves receiving user input of estimated design information for the second portion of the integrated circuit design. A third step generally involves automatically generating one or more representative blocks representing the second portion of the integrated circuit design based on the user input. The one or more representative blocks may be generated having substantially equivalent size and characteristics to one or more actual blocks developed for the second portion of the integrated circuit design.

The objects, features and advantages of the present invention include providing a method for resource estimation during design planning that may (i) automatically generate estimated RTL or gate representations based upon a user's high-level estimations, (ii) provide estimated RTL or gate representations having substantially equivalent characteristics to actual RTL or gates of a finished design, (iii) allow incomplete designs to be analyzed, (iv) allow high-level floorplanning before RTL is complete and/or (v) automatically generate representative RTL for an incomplete design that can be run through an entire tool flow.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
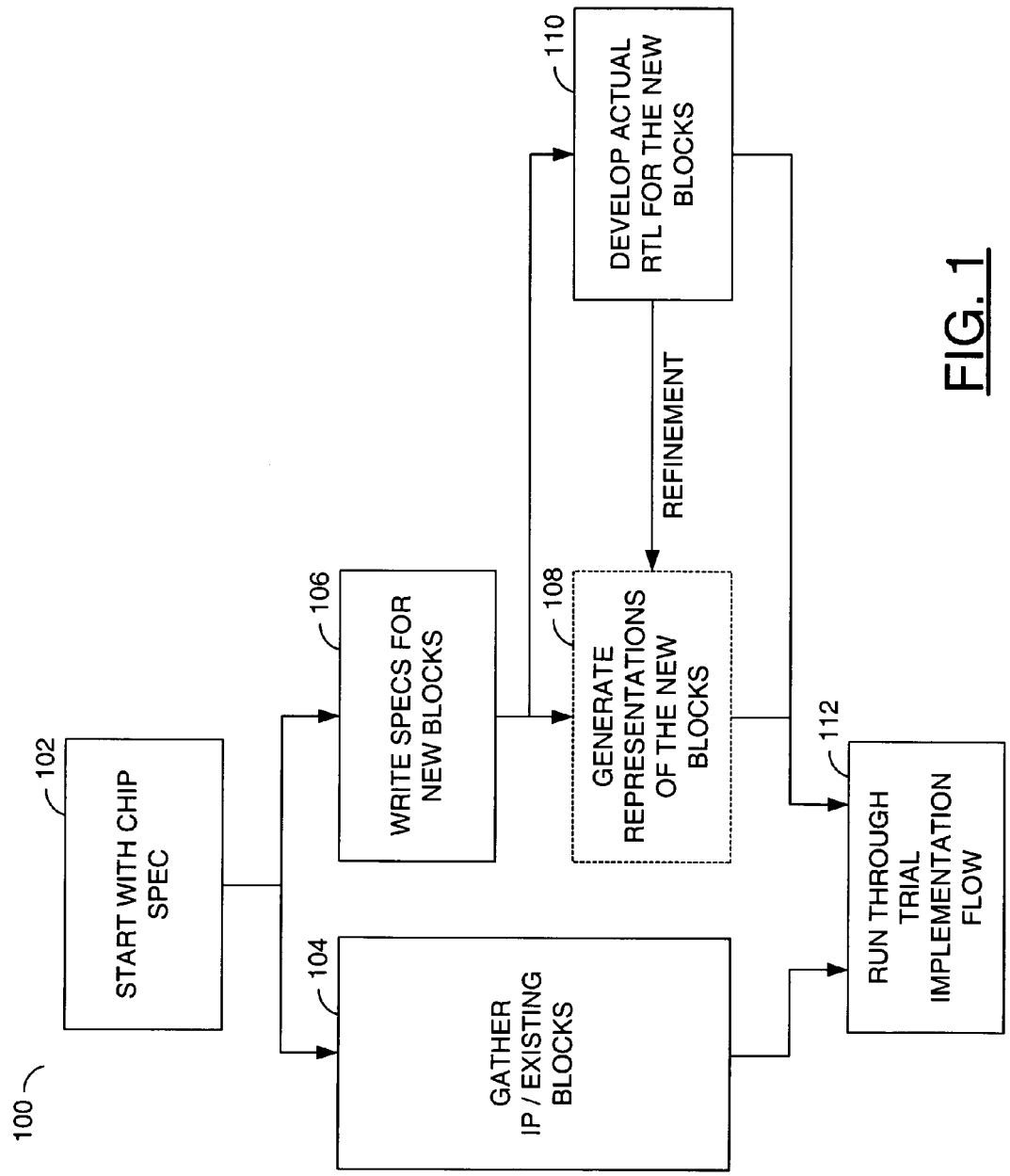
FIG. 1 is a block diagram illustrating a portion of a design flow in accordance with a preferred embodiment of the present invention.

Referring to FIG. 1, a block diagram is shown illustrating a portion of a design planning flow 100 in accordance with a preferred embodiment of the present invention. The design planning flow 100 may comprise a block (or step) 102, a block (or step) 104, a block (or step) 106, a block (or step) 108, a block (or step) 110 and a block (or step) 112. The block 102 may comprise an integrated circuit (or chip) design specification gathering step. The block 104 may comprise an intellectual property (IP)/existing block gathering step. The block 106 may comprise a new block specification writing step. The block 108 may comprise a representative (or dummy) block generating step. The block 110 may comprise a development step for generating real register transfer level (RTL) representations of the new blocks. The block 112 may comprise a trial implementation flow step.

In the block 102, specifications for an integrated circuit (or chip) design may be gathered. In the block 104, information (e.g., register transfer level (RTL) representations) may be gathered for IP and existing (or complete) blocks specified in the integrated circuit design. In the block 106, specifications for new (or incomplete) design blocks contained in the integrated circuit design specification may be written (or generated). When the specifications for the new design blocks are complete, the specifications may be used to generate representative (or dummy) blocks (e.g., in the block 108) and to develop final (or actual) RTL representations for the new blocks (e.g., in the block 110). The generation of the representative blocks and the actual RTL representations may be performed in parallel. In general, the representative blocks comprise representations of the actual RTL for the new design blocks which has yet to be written. In one example, the information from the development of the actual RTL for the new design blocks may be used to refine the representative blocks generated in the block 108.

In the block 108, representative (or dummy) blocks (e.g., estimated or representative RTL and/or gate representations) may be generated based on the specifications written for the new design blocks in the block 106. The generation of the representative blocks may be refined (or modified) using information from the block 110 gathered during the development of the final (or actual) RTL representations for the new design blocks. In the block 110, the actual RTL descriptions for the new design blocks may be generated (or written) by a designer using conventional techniques.

In the block 112, the IP and existing block representations (e.g., actual RTL, etc.) gathered in the block 104, the representative blocks generated in the block 108, and any actual RTL descriptions for the new design blocks from the block 110 may be gathered to perform a trial implementation flow. The trial implementation flow may be implemented with conventional tools or tool suites. In one example, the development of the actual RTL representations (e.g., the block 110) may be performed in parallel with the trial implementation flow. As final RTL representations of blocks and/or sub-blocks are completed, the corresponding representative blocks may be replaced by the actual RTL representations in the trial implementation flow.

Figure 2:
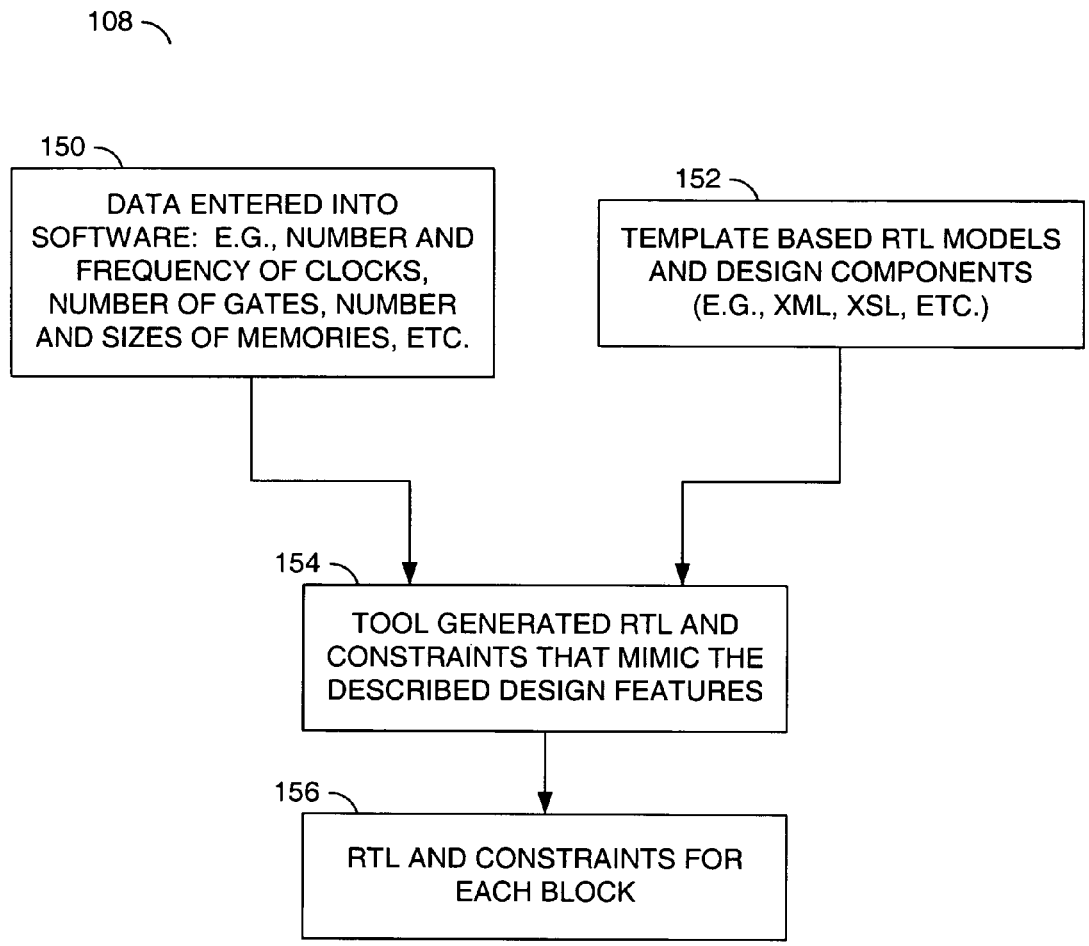
FIG. 2 is a block diagram illustrating a resource estimation process in accordance with a preferred embodiment of the present invention.

Referring to FIG. 2, a more detailed block diagram is shown illustrating an example process for generating representative blocks. In one example, the block 108 may comprise a block (or step) 150, a block (or step) 152, a block (or step) 154 and a block (or step) 156. The block 150 may comprise a data gathering step. The block 152 may comprise templates for generating representative blocks. The block 154 may comprise a representative RTL generating step. The block 156 may comprise an output step.

In the step 150, data may be gathered by (or entered into) a tool (e.g., software) configured to generate RTL and constraints that mimic (or approximate) the specifications of the new design blocks. For example, information regarding number and frequency of clocks, number of gates, number and size of memories, etc. may be entered for the new design blocks of the integrated circuit design. In general, the more information about the new design blocks that is entered, the better the estimated RTL generated will be. In the block 152, template-based RTL models and/or design components may be gathered for use in generating the estimated RTL (or gate) representations of the new design blocks. In one example, the template-based RTL models and design components may be described using any standard method (e.g., XML, XSL, etc.). In one example, the RTL models and design components may include actual RTL representations developed in the block 110. For example, when a sub-block of a representative block is completed (e.g., the real RTL is written), the sub-block may be instantiated by the encompassing representative block in advance of the real RTL for the entire representative block.

In the block 154, the design tool in accordance with the present invention may be configured to generate the estimated RTL and constraints that mimic the described design features for the new design blocks based on (i) the data entered in the block 150 and (ii) the template-based RTL models and design components gathered in the block 152. In the block 156, the estimated RTL and constraints for each block may be presented.

In general, the present invention provides a method for gathering input from a user and automatically generating representative RTL (or gates) of equivalent size and characteristics to meet the design specifications of incomplete blocks. In general, the accuracy of the representative RTL (or gates) is based on the quality of information received. For example, the information may include whether a block has a single, or multiple clocks at a target frequency. If the block has multiple clocks, the information may specify proportions of the block for each clock. The representative RTL generated may automatically instantiate any memories that are specified. The representative RTL may have a selectable proportion of logic to registers. The representative RTL may have sub-blocks defined with varying clocks, logic to register ratios, memories etc. In one example, some of the sub-blocks may include real (or actual) RTL (e.g., when the sub-block or module has already been written, the module may be included as-is).

In one example, the descriptions of the blocks may have a 'levels of logic' profile (e.g., a profile for determining the percentage of paths at which various levels of logic occur). For example, a profile may specify 15% of the block may be more than 20 levels of logic, 25% may be 15-20 levels, 40% may be 10-15 levels and 20% may be less than 10 levels. Default profiles may be implemented for various types of logic (e.g., state machines, hard-coded digital signal processors, bus interfaces, input/output interfaces, etc.) to speed up the process of assembling an estimated design.

Based on the inputs, the tool in accordance with the present invention may be configured to generate estimated RTL (or gates) representations for the new design blocks. The estimated RTL representations are generated having characteristics approximate to the final (or actual) RTL for the new design blocks (e.g., under development in the block 110). Because the estimated RTL generated in accordance with the present invention should be available before the actual (or final) RTL is written, the present invention generally allows device planners to floorplan and derive accurate estimates of area, frequency, timing and power before the design is complete.

In general, the estimated design (or RTL) may be completed by instantiating standard representative blocks of code that have no real functional purpose, but will synthesize into something that has known characteristics. The representative blocks are generally configured to have representative features of the intended final design. The accuracy of the estimated RTL generally depends on the amount and/or completeness of information provided by the user.

In general, running an incomplete design through an entire design flow is not practical. The present invention generally provides the ability to perform detailed analysis on a design before the design is completed. For example, if 70% of a device is existing IP and 30% will be new logic that has not yet been written, information about the remaining 30% may be entered by the designer and 'representative RTL' may be automatically generated. The existing IP together with the representative RTL may be run through an entire tool flow to get very valuable results about area, frequency, timing, power, etc.

The analysis using the combined IP and representative RTL may be much more valuable than running the flow with just the 70%. For example, the utilization will generally not be correct when the design is not complete. The analysis may include gate count/area estimation (e.g., for slice selection), power estimation, frequency estimation, timing estimation and/or resource planning. The present invention may allow high level floorplanning to be performed before the actual RTL for an entire design is complete. In general, the more complete information that can be inserted, the better the results that can be achieved. The present invention may improve the quality of design planning and programmable platform selection significantly.

The function performed by the flow diagram of FIGS. 1 and 2 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for estimating resources during design planning comprising the steps of:
   (A) receiving design information for an integrated circuit design, wherein a first portion of said integrated circuit design is complete and a second portion of said integrated circuit design is incomplete;
   (B) receiving user input of estimated design information for said second portion of said integrated circuit design; and
   (C) automatically generating one or more representative blocks representing said second portion of said integrated circuit design based on said user input, wherein said one or more representative blocks comprise an estimated register transfer level (RTL) representation of said second portion of said integrated circuit design, wherein said estimated RTL representation comprises one or more representative blocks of code that (i) have no real functional purpose and (ii) when synthesized have a size and characteristics substantially equivalent to a final actual RTL description for said second portion of said integrated circuit design, and wherein said estimated RTL representation has a proportion of logic to registers that is configurable in response to said user input.

2. The method according to claim 1, wherein said one or more representative blocks further comprise a gate level representation of said second portion.

3. The method according to claim 1, wherein said estimated RTL representation automatically instantiates any memories specified by said user input.

4. The method according to claim 1, wherein said estimated RTL representation comprises one or more sub-blocks defined with varying clocks.

5. The method according to claim 1, wherein said estimated RTL representation comprises one or more sub-blocks defined with varying logic to register ratios.

6. The method according to claim 1, wherein said estimated RTL representation comprises one or more sub-blocks defined with various memories.

7. The method according to claim 1, wherein said estimated RTL representation comprises one or more sub-blocks defined with a levels of logic profile.

8. The method according to claim 1, wherein said estimated RTL representation comprises one or more sub-blocks defined by default profiles for determining the percentage of paths at which various levels of logic occur for types of logic selected from the group consisting of state machines, hard-coded digital signal processors (DSPs), bus interfaces and input/output interfaces.

9. The method according to claim 1, further comprising the step of refining said one or more representative blocks with information generated during development of the actual register transfer level (RTL) descriptions for said one or more actual blocks.

10. The method according to claim 1, further comprising the step of:
   performing a trial implementation flow analysis on said integrated circuit design using said one or more representative blocks.

11. A design tool for estimating resources during design planning configured to:
  receive design information for an integrated circuit design, wherein a first portion of said integrated circuit design is complete and a second portion of said integrated circuit design is incomplete;
  receive user input of estimated design information for said second portion of said integrated circuit design; and
  automatically generate an estimated register transfer level (RTL) representation of said second portion of said integrated circuit design based on said user input, wherein said estimated RTL representation comprises one or more representative blocks of code that (i) have no real functional purpose, (ii) when synthesized have a size and characteristics substantially equivalent to a final actual RTL description for said second portion of said integrated circuit design, and (iii) have a proportion of logic to registers that is configurable in response to said user input.

12. The design tool according to claim 11, wherein said estimated RTL representation automatically instantiates any memories specified by said user input.

13. The design tool according to claim 11, wherein said design tool is further configured to generate said estimated RTL representation comprising one or more sub-blocks selected from the group consisting of (i) sub-blocks defined with varying clocks, (ii) sub-blocks defined with varying logic to register ratios, (iii) sub-blocks defined with various memories, (iv) sub-blocks defined with a levels of logic profile for determining a percentage of paths at which various numbers of levels of logic occur and (v) sub-blocks defined by default profiles for determining a percentage of paths at which various numbers of levels of logic occur for types of logic selected from the group consisting of state machines, hard-coded digital signal processors (DSPs), bus interfaces and input/output interfaces.

14. The design tool according to claim 11, further configured to:
  refine one or more representative blocks of said estimated register transfer level (RTL) representation with information generated during development of the actual register transfer level (RTL) descriptions for one or more corresponding actual blocks; and
  perform a trial implementation flow analysis on said integrated circuit design using said one or more representative blocks.

15. A computer readable medium containing computer executable instructions for estimating resources during design planning comprising instructions for:
  receiving design information for an integrated circuit design, wherein a first portion of said integrated circuit design is complete and a second portion of said integrated circuit design is incomplete;
  receiving user input of estimated design information for said second portion of said integrated circuit design; and
  automatically generating an estimated register transfer level (RTL) representation of said second portion of said integrated circuit design based on said user input, wherein said estimated RTL representation comprises one or more representative blocks of code that (i) have no real functional purpose, (ii) when synthesized have a size and characteristics substantially equivalent to a final actual RTL description for said second portion of said integrated circuit design, and (iii) have a proportion of logic to registers that is configurable in response to said user input.

16. The method according to claim 1, further comprising:
  developing the actual RTL representation of said second portion in parallel with performing a trial implementation flow analysis using said estimated RTL representation of said second portion.

17. A method for estimating resources during design planning comprising the steps of:
  (A) receiving design information for an integrated circuit design, wherein a first portion of said integrated circuit design is complete and a second portion of said integrated circuit design is incomplete;
  (B) receiving user input of estimated design information for said second portion of said integrated circuit design;
  (C) automatically generating one or more representative blocks representing said second portion of said integrated circuit design based on said user input, wherein said one or more representative blocks comprise an estimated register transfer level (RTL) representation of said second portion of said integrated circuit design, wherein said estimated RTL 15 representation comprises one or more representative blocks of code that (i) have no real functional purpose and (ii) when synthesized have a size and characteristics substantially equivalent to a final actual RTL description for said second portion of said integrated circuit design, and wherein said estimated RTL representation has a proportion of logic to registers that is configurable in response to said user input; and
  (D) developing an actual RTL representation of said second portion in parallel with performing a trial implementation flow analysis using said estimated RTL representation of said second portion.

18. The method according to claim 17, further comprising the step of:
  refining said one or more representative blocks of code of said estimated register transfer level (RTL) representation with information generated while developing said actual register transfer level (RTL) representation of said second portion.

19. The method according to claim 1, wherein said estimated RTL representation further comprises (i) one or more clocks having a target frequency based on said user input and (ii) a proportion of said second portion of said integrated circuit design using each of said one or more clocks that is configurable in response to said user input.

20. The method according to claim 1, wherein said size and characteristics include area, frequency, timing and power.

* * * * *